United States Patent
Subramanian et al.

(10) Patent No.: US 11,145,343 B1
(45) Date of Patent: Oct. 12, 2021

(54) METHOD FOR CONTROLLING MULTI-CYCLE WRITE LEVELING PROCESS IN MEMORY SYSTEM

(71) Applicant: FARADAY TECHNOLOGY CORPORATION, Hsinchu (TW)

(72) Inventors: Sivaramakrishnan Subramanian, Hsinchu (TW); Hong-Yi Wu, Hsinchu (TW); Sridhar Cheruku, Hsinchu (TW); Ko-Ching Chao, Hsinchu (TW)

(73) Assignee: FARADAY TECHNOLOGY CORPORATION, Hsinchu (TW)

(*) Notice: Subject to any disclaimer, the term of this patent is extended or adjusted under 35 U.S.C. 154(b) by 0 days.

(21) Appl. No.: 16/953,560

(22) Filed: Nov. 20, 2020

(51) Int. Cl.
  *G11C 8/18* (2006.01)
  *G11C 7/22* (2006.01)
  *G11C 8/06* (2006.01)
  *G11C 16/34* (2006.01)

(52) U.S. Cl.
  CPC .............. *G11C 8/18* (2013.01); *G11C 7/222* (2013.01); *G11C 8/06* (2013.01); *G11C 16/3495* (2013.01)

(58) Field of Classification Search
  CPC .. G11C 8/06; G11C 8/18; G11C 7/222; G11C 16/3495
  USPC ..................................................... 365/233.1
  See application file for complete search history.

(56) References Cited

U.S. PATENT DOCUMENTS

| | | | |
|---|---|---|---|
| 7,038,953 B2* | 5/2006 | Aoki | G11C 7/1051 365/189.05 |
| 7,197,675 B2* | 3/2007 | Chu | G06F 13/4239 711/105 |
| 7,590,008 B1 | 9/2009 | Roge et al. | |
| 8,589,654 B2* | 11/2013 | Takai | G11C 7/109 711/167 |
| 8,780,655 B1* | 7/2014 | Kumar | G11C 7/1066 365/194 |
| 8,972,790 B2* | 3/2015 | Nakabayashi | G06F 13/1673 714/37 |
| 9,305,617 B2* | 4/2016 | Oda | G11C 7/1072 |
| 10,297,310 B2 | 5/2019 | Prakash et al. | |
| 10,304,517 B2* | 5/2019 | Giovannini | G06F 12/0646 |
| 10,332,575 B2* | 6/2019 | Penney | G11C 7/109 |
| 10,607,685 B2* | 3/2020 | Giovannini | G06F 12/0646 |
| 10,964,364 B2* | 3/2021 | Shon | G11C 7/1084 |
| 2007/0230266 A1* | 10/2007 | Kao | G11C 7/1051 365/189.16 |

* cited by examiner

*Primary Examiner* — Son L Mai
(74) *Attorney, Agent, or Firm* — WPAT, PC

(57) ABSTRACT

A method for controlling a multi-cycle write leveling process in a memory system is provided. After a write leveling process is completed and before a write training process is performed, the multi-cycle write leveling process is performed. Consequently, when a DDR memory of the memory system receives a clock signal and a first data strobe signal, the DDR memory can confirm that the signal edges of the clock signal and the first data strobe signal are aligned with each other and the signal edges are accurate.

9 Claims, 5 Drawing Sheets

METHOD FOR CONTROLLING MULTI-CYCLE WRITE LEVELING PROCESS IN MEMORY SYSTEM

FIELD OF THE INVENTION

The present invention relates to a method for controlling a memory system, and more particularly to a method for controlling a multi-cycle write leveling process in a memory system.

BACKGROUND OF THE INVENTION

As known, a double data rate memory (also abbreviated as DDR memory) is one of the common memories. FIG. 1 is a schematic block diagram illustrating a conventional DDR memory system. As shown in FIG. 1, the DDR memory system 100 comprises a processing circuit 110 and a DDR memory 120.

The processing circuit 110 and the DDR memory 120 are in communication with each other through a memory bus 122. Consequently, various signals can be transmitted between the processing circuit 110 and the DDR memory 120 through the memory bus 122. The signals to be transmitted through the memory bus 122 at least contain a clock signal CLK, an address signal CA, a command signal CMD, a data signal DQ, a first data strobe signal DQS_t and a second data strobe signal DQS_c. The address signal CA and the command signal CMD are operated according to the clock signal CLK. The data signal DQ is operated according to the first data strobe signal DQS_t and the second data strobe signal DQS_c. The phase difference between the first data strobe signal DQS_t and the second data strobe signal DQS_c is 180 degrees.

The command signal CMD contains a chip select signal CS, a column address strobe CAS, a row address strobe RAS and a write enable signal WE. The address signal CA contains signals CA0~CA6. The data signal DQ contains signals DQ0~DQ31.

In the new generation and future generations of the DDR memory system 100, the DDR memory 120 is designed by using a source-synchronous unmatched scheme. The DDR memory 120 may be 4th generation low power DDR memory (LPDDR4), 4×-th generation low power DDR memory (LPDDR4×) or 5th generation DDR memory (LPDDR5). In the DDR memory 120 with the source-synchronous unmatched scheme, the first data strobe signal DQS_t and the data signal DQ have different delaying times.

FIG. 2 is a schematic circuit diagram illustrating a conventional DDR memory. A receiver of the DDR memory 120 comprises a comparator 132, a comparator 134, a delay circuit 136 and a deserializer (DES) 138. The two input terminals of the comparator 132 receive the first data strobe signal DQS_t and the second data strobe signal DQS_c, respectively. An output terminal of the comparator 132 generates a third data strobe signal diff_DQS. The delay circuit 136 is a data strobe tree (DQS tree) for delaying the third data strobe signal diff_DQS and generating a fourth data strobe signal diff_DQS_d.

The two input terminals of the comparator 134 receive the data signal DQ and a reference voltage Vref, respectively. A sampling control terminal of the comparator 134 receives the fourth data strobe signal diff_DQS_d. An output terminal of the comparator 134 generates a serial data Data_s. An input terminal of the deserializer 238 generates a parallel data Data_p.

In the receiver of the DDR memory 120, the delay circuit 136 can adjust the delaying time of the third data strobe signal diff_DQS. Moreover, the data signal DQ is sampled according to the fourth data strobe signal diff_DQS_d, and the serial data Data_s is generated.

During an initialization process of the DDR memory system 100, a series of training processes are performed by the processing circuit 110. For example, the training processes include a write leveling process and a write training process. After the initialization process, the DDR memory system 100 enters a normal working state.

The processing circuit 110 and the DDR memory 120 of the DDR memory system 100 are fixed on a circuit board. Moreover, plural layout traces of the memory bus 122 are also formed on the circuit board. In case that the lengths of the layout traces are different, the time periods of transferring the clock signal CLK and the first data strobe signal DQS_t may be different. For solving this drawback, the DDR memory system 100 has to perform the write leveling process. Consequently, when the clock signal CLK and the first data strobe signal DQS_t are transferred to the DDR memory 120, the signal edges of the clock signal CLK and the first data strobe signal DQS_t are aligned with each other.

While the write leveling process is performed, the processing circuit 110 issues the clock signal CLK and the first data strobe signal DQS_t to the DDR memory 120. Then, the processing circuit 110 continuously adjusts the delaying time of the first data strobe signal DQS_t. That is, the phase difference between the first data strobe signal DQS_t and the clock signal CLK is adjusted. When the DDR memory 120 receives the clock signal CLK and the first data strobe signal DQS_t, the DDR memory 120 further judges whether the signal edges of the clock signal CLK and the first data strobe signal DQS_t are aligned with each other. Moreover, the DDR memory 120 issues the data signal DQ to respond to the processing circuit 110.

For example, if the DDR memory 120 samples the clock signal CLK at the time point corresponding to the rising edge of the first data strobe signal DQS_t, the DDR memory 120 issues the data signal DQ to respond to the processing circuit 110.

If the sampling result of the write leveling process is in a low level state, it means that the signal edges of the first data strobe signal DQS_t and the clock signal CLK are not aligned with each other. Meanwhile, the data signal DQ in the low level state is transmitted from the DDR memory 120 to the processing circuit 110.

According to the data signal DQ in the low level state, the processing circuit 110 continuously adjusts the phase difference between the first data strobe signal DQS_t and the clock signal CLK. For example, the delaying time of the first data strobe signal DQS_t is increased until the sampling result obtained by the DDR memory 120 is in a high level state. When the sample result is in the high level state, the data signal DQ in the high level state is transmitted from the DDR memory 120 to the processing circuit 110. According to the data signal DQ in the high level state, the processing circuit 110 records a specific phase difference between the first data strobe signal DQS_t and the clock signal CLK. Meanwhile, the write leveling process is completed.

When the first sample result is in the high level state, the processing circuit 110 still cannot confirm whether the signal edges of the first data strobe signal DQS_t and the clock signal CLK are aligned with each other. Then, the processing circuit 110 continuously adjusts the phase difference between the first data strobe signal DQS_t and the clock signal CLK. For example, the delaying time of the first data strobe signal DQS_t is decreased until the sampling result obtained by the DDR memory 120 is in the low level state. When the sample result is in the low level state, the data signal DQ in the low level state is transmitted from the DDR memory 120 to the processing circuit 110.

Then, the processing circuit 110 increases the delaying time of the first data strobe signal DQS_t again. Consequently, the sampling result obtained by the DDR memory 120 is in the high level state, and the data signal DQ in the high level state is transmitted from the DDR memory 120 to the processing circuit 110. At the same time, the processing circuit 110 records the specific phase difference between the first data strobe signal DQS_t and the clock signal CLK, and the write leveling process is completed.

After the write leveling process is completed, the first data strobe signal DQS_t and the clock signal CLK with the specific phase difference therebetween are outputted from the processing circuit 110. After the two signals are transferred through the layout traces of the memory bus 122, the first data strobe signal DQS_t and the clock signal CLK with the aligned signal edges are received by the DDR memory 120.

Then, the processing circuit 110 performs the write training process. While the write training process is performed, the processing circuit 110 adjusts the phase differences between the first data strobe signal DQS_t, the second data strobe signal DQS_c and the data signal QS and acquires a specified timing margin. Consequently, it is assured that the DDR memory 120 is able to successfully latch the data signal QS in the specified timing margin according to the first data strobe signal DQS_t and the second data strobe signal DQS_c.

However, the conventional DDR memory system 100 still has some drawbacks. For example, after the write leveling process is completed, the processing circuit 110 is only able to confirm that the signal edges of the first data strobe signal DQS_t and the clock signal CLK received by the DDR memory 120 are aligned with each other. However, the processing circuit 110 is unable to confirm whether the signal edges are accurate.

For example, if the layout trace of the memory bus 122 corresponding to the clock signal CLK is longer the layout trace of the memory bus 122 corresponding to the first data strobe signal DQS_t, the propagation delay of the clock signal CLK is longer. Consequently, after the write leveling process is completed, the time point of receiving the clock signal CLK by the DDR memory 120 is possibly later than the time point of receiving the first data strobe signal DQS_t by the DDR memory 120. The difference between these two time points is equal to one-pulse clock cycle. Even if the signal edges of the first data strobe signal DQS_t and the clock signal CLK are aligned with each other, the DDR memory 120 is unable to acquire the data from the processing circuit 110 in the subsequent process according to the data signal DQ.

Similarly, if the layout trace of the memory bus 122 corresponding to the first data strobe signal DQS_t is longer the layout trace of the memory bus 122 corresponding to the clock signal CLK, the propagation delay of the first data strobe signal DQS_t is longer. Consequently, after the write leveling process is completed, the time point of receiving the first data strobe signal DQS_t by the DDR memory 120 is possibly later than the time point of receiving the clock signal CLK by the DDR memory 120. The difference between these two time points is equal to one-pulse clock cycle. Even if the signal edges of the first data strobe signal DQS_t and the clock signal CLK are aligned with each other, the DDR memory 120 is unable to acquire the data from the processing circuit 110 in the subsequent process according to the data signal DQ.

SUMMARY OF THE INVENTION

An embodiment of the present invention provides a method for controlling a multi-cycle write leveling process in a memory system. The memory system includes a DDR memory. The method includes the following steps. In a step (a), a write data is stored into the DDR memory, and the write data is read from the DDR memory. Then, a step (b) is performed to judge whether the write data stored in the DDR memory and the write data read from the DDR memory match each other to generate a data match event. If the data match event is not generated, another step is performed to judge whether a first delaying time of a data signal has been adjusted to a first upper limit. In a step (c), if the first delaying time of the data signal has not been adjusted to the first upper limit, the first delaying time of the data signal is increased and then the step (a) is repeatedly done. In a step (d), if the first delaying time of the data signal has been adjusted to the first upper limit, another step is performed to judge whether a second delaying time of a first data strobe signal has been adjusted to a second upper limit. In a step (e), if the second delaying time of the first data strobe signal has not been adjusted to the second upper limit, the second delaying time of the first data strobe signal is increased and then the step (a) is repeatedly done. In a step (f), if the second delaying time of the first data strobe signal has been adjusted to the second upper limit, another step is performed to judge whether a third delaying time of an address/command signal has been adjusted to a third upper limit. In a step (g), if the third delaying time of the address/command signal has not been adjusted to the third upper limit, the third delaying time of the address/command signal is increased and then the step (a) is repeatedly done.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
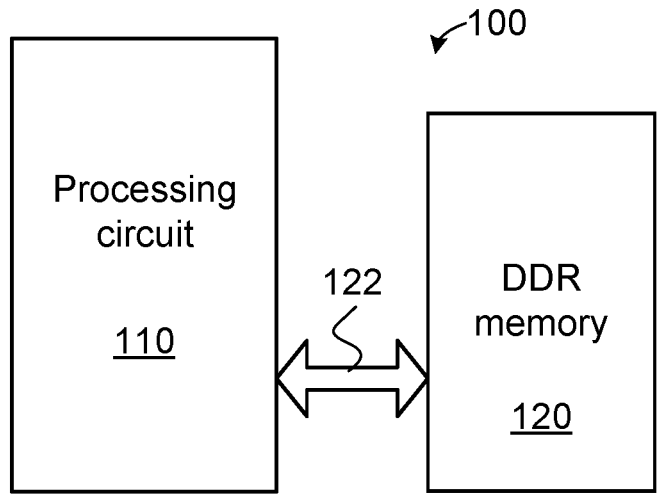
FIG. 1 (prior art) is a schematic block diagram illustrating a conventional DDR memory system.
Figure 2:
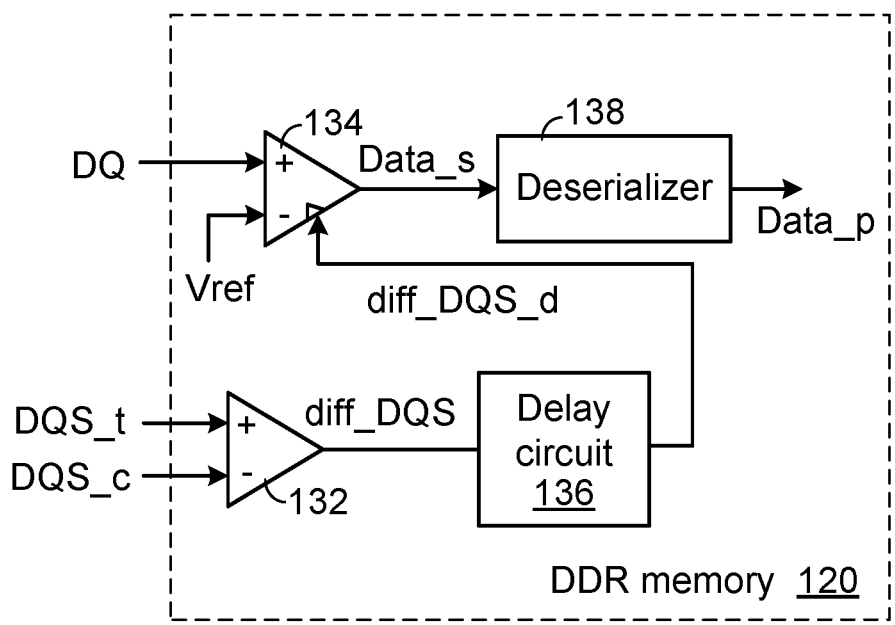
FIG. 2 (prior art) is a schematic circuit diagram illustrating a conventional DDR memory.
Figure 3:
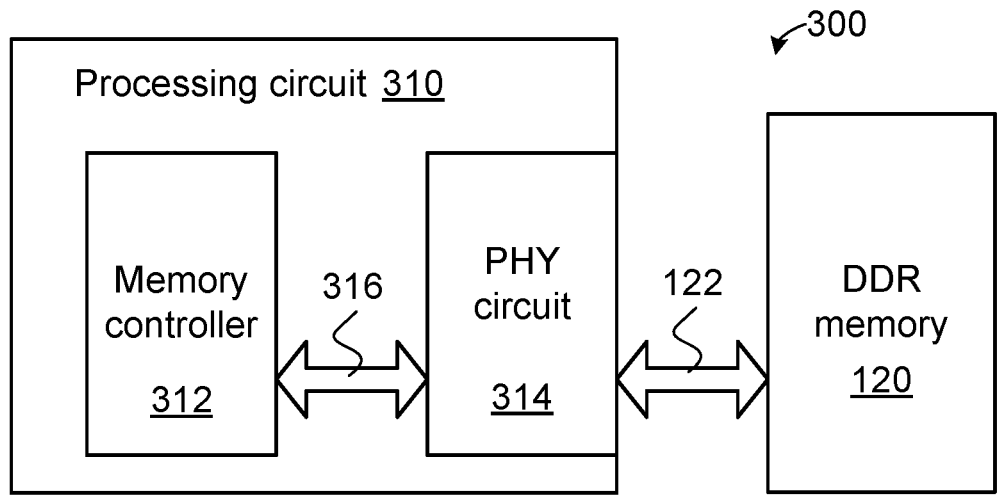
FIG. 3 is a schematic block diagram illustrating a DDR memory system according to an embodiment of the present invention.

FIG. 3 is a schematic block diagram illustrating a DDR memory system according to an embodiment of the present invention. As shown in FIG. 3, the DDR memory system 300 comprises a processing circuit 310 and a DDR memory 120.

The processing circuit 310 comprises a memory controller 312 and a physical layer (PHY) circuit 314. The PHY circuit 314 and the DDR memory 120 exchange various signals through a memory bus 122. A DDR PHY Interface 316, which is also referred as a DFI interface, is connected between the memory controller 312 and the PHY circuit 314.

The signals to be transmitted through the memory bus 122 at least contain a clock signal CLK, an address signal CA, a command signal CMD, a data signal DQ, a first data strobe signal DQS_t and a second data strobe signal DQS_c. The phase difference between the first data strobe signal DQS_t and the second data strobe signal DQS_c is 180 degrees. The address signal CA and the command signal CMD are operated according to the clock signal CLK. The data signal DQ is operated according to the first data strobe signal DQS_t and the second data strobe signal DQS_c. The command signal CMD contains a chip select signal CS, a column address strobe CAS, a row address strobe RAS and a write enable signal WE.

In the DDR memory system 300, plural layout traces of the memory bus 122 are formed on a circuit board. In case that the lengths of the layout traces are different, the time periods of transferring the clock signal CLK and the first data strobe signal DQS_t from the processing circuit 310 may be different. For solving this drawback, the DDR memory system 300 has to perform a write leveling process. Consequently, when the clock signal CLK and the first data strobe signal DQS_t are transferred to the DDR memory 120, the signal edges of the clock.

After the write leveling process is completed, the first data strobe signal DQS_t and the clock signal CLK with a specific phase difference therebetween are outputted from the processing circuit 310. After the two signals are transferred through the layout traces of the memory bus 122, the first data strobe signal DQS_t and the clock signal CLK with the aligned signal edges are received by the DDR memory 120. After the write leveling process is completed, the processing circuit 310 is only able to confirm that the signal edges of the first data strobe signal DQS_t and the clock signal CLK received by the DDR memory 120 are aligned with each other. However, the processing circuit 110 is unable to confirm whether the signal edges are accurate.

Figure 4A:
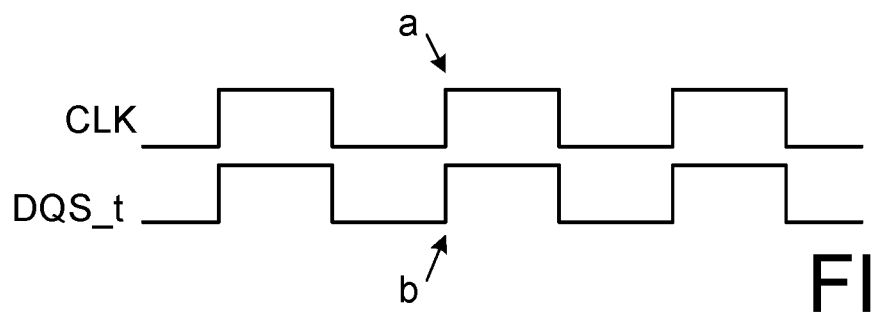
FIGS. 4A, 4B and 4C are schematic waveform diagrams illustrating some situations that the signal edges of the first data strobe signal and the clock signal are aligned with each other.
Figure 4B:
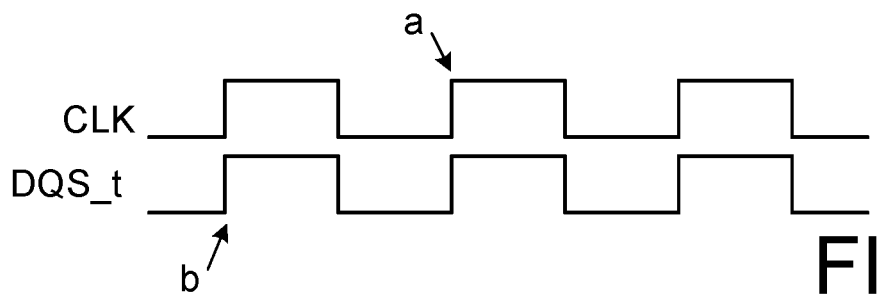
Figure 4C:
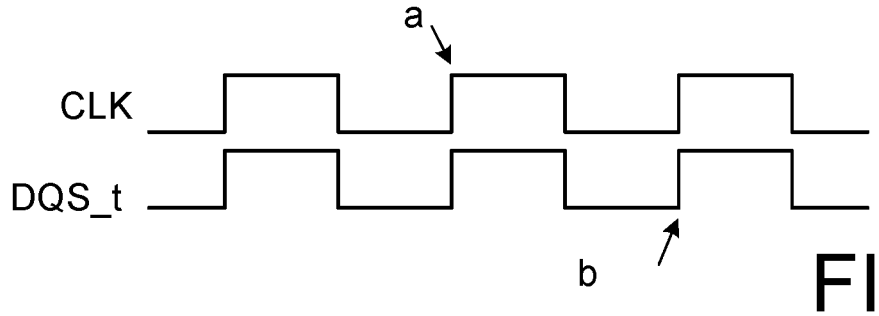

FIGS. 4A, 4B and 4C are schematic waveform diagrams illustrating some situations that the signal edges of the first data strobe signal DQS_t and the clock signal CLK are aligned with each other. After the write leveling process is completed, there is the specified phase different between a rising edge a of the clock signal CLK and a rising edge of the first data strobe signal DQS_t.

An ideal situation is shown in FIG. 4A. After the first data strobe signal DQS_t and the clock signal CLK, the signal edges b and a of the first data strobe signal DQS_t and the clock signal CLK received by the DDR memory 120 are aligned with each other.

If the layout trace of the memory bus 122 corresponding to the clock signal CLK is longer the layout trace of the memory bus 122 corresponding to the first data strobe signal DQS_t, the propagation delay of the clock signal CLK is longer. Please refer to FIG. 4B. After the write leveling process is completed, the time point of receiving the clock signal CLK by the DDR memory 120 is later than the time point of receiving the first data strobe signal DQS_t by the DDR memory 120. The time difference between the two time points corresponding to the signal edge b of the first data strobe signal DQS_t and the signal edge a of the clock signal CLK is equal to one-pulse clock cycle. In a worse situation, the time difference between the two time points corresponding to the signal edge b of the first data strobe signal DQS_t and the signal edge a of the clock signal CLK is more than one-pulse clock cycle.

Similarly, if the layout trace of the memory bus 122 corresponding to the first data strobe signal DQS_t is longer the layout trace of the memory bus 122 corresponding to the clock signal CLK, the propagation delay of the first data strobe signal DQS_t is longer. Please refer to FIG. 4C. After the write leveling process is completed, the time point of receiving the first data strobe signal DQS_t by the DDR memory 120 is possibly later than the time point of receiving the clock signal CLK by the DDR memory 120. The time difference between the two time points corresponding to the signal edge b of the first data strobe signal DQS_t and the signal edge a of the clock signal CLK is equal to one-pulse clock cycle. In a worse situation, the time difference between the two time points corresponding to the signal edge b of the first data strobe signal DQS_t and the signal edge a of the clock signal CLK is more than one-pulse clock cycle.

As mentioned above in the situations of FIGS. 4B and 4C, even if the signal edges of the first data strobe signal DQS_t and the clock signal CLK are aligned with each other, the DDR memory 120 is unable to acquire the data from the processing circuit 310 in the subsequent process according to the data signal DQ.

For overcoming the above drawbacks, the PHY circuit 314 of the processing circuit 310 is equipped with a control circuit for performing a multi-cycle write leveling process. Consequently, when the DDR memory 120 receives the clock signal CLK and the first data strobe signal DQS_t, the DDR memory 120 can confirm that the signal edges of the clock signal CLK and the first data strobe signal DQS_t are aligned with each other and the signal edges are accurate.

Figure 5:
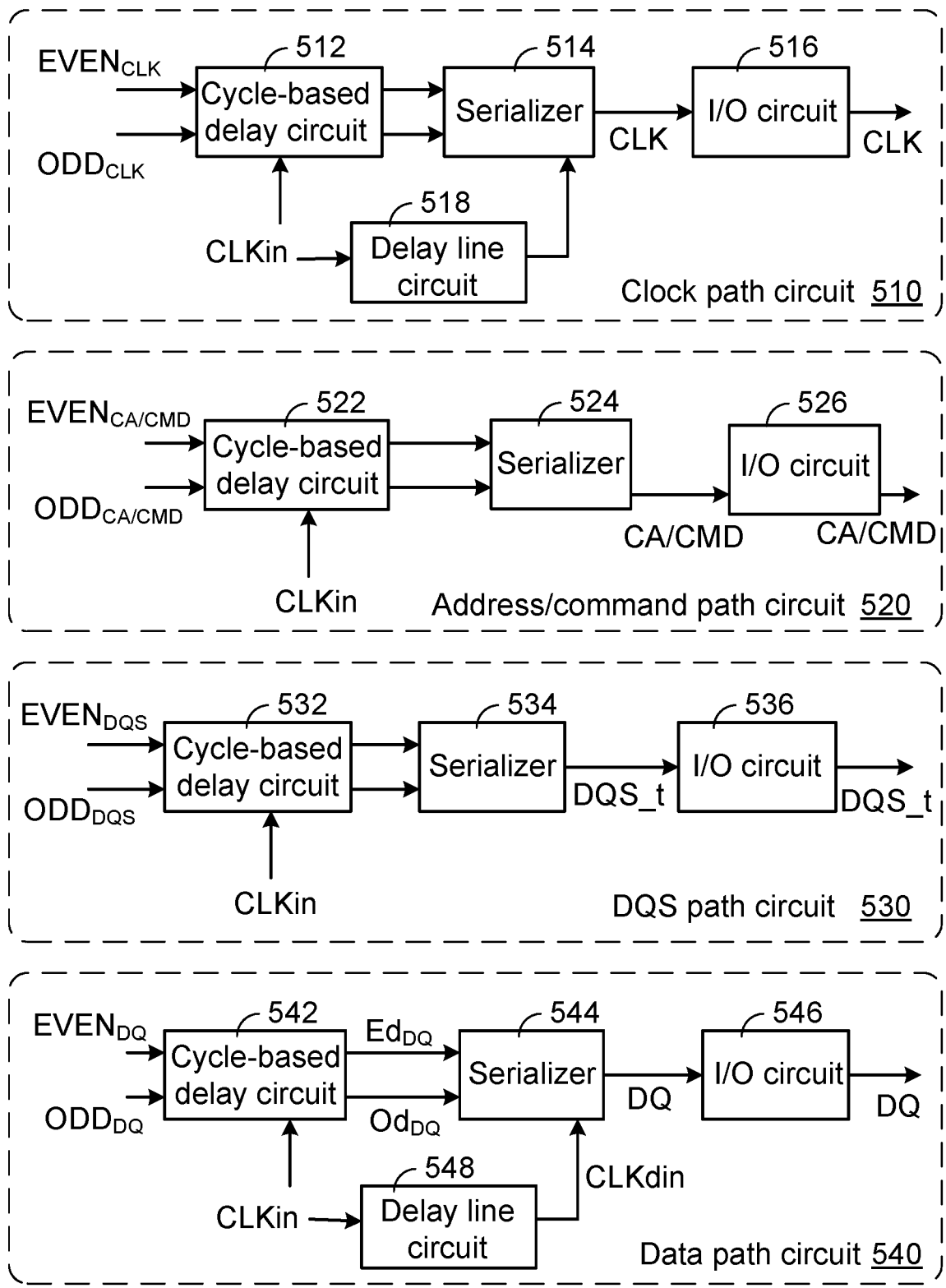
FIG. 5 is a schematic circuit block diagram illustrating a control circuit according to an embodiment of the present invention.

FIG. 5 is a schematic circuit block diagram illustrating a control circuit according to an embodiment of the present invention. The control circuit is included in the PHY circuit 314 of the processing circuit 310. The control circuit is configured to adjust the delaying times of the clock signal CLK, the address signal CA, the command signal CMD, the data signal DQ, the first data strobe signal DQS_t and the second data strobe signal DQS_c. As shown in FIG. 5, the control circuit comprises a clock path circuit 510, an address/command path circuit 520, a data strobe (DQS) path circuit 530 and a data path circuit 540.

The data path circuit 540 comprises a cycle-based delay circuit 542, a delay line circuit 548, a serializer 544 and an input/output (I/O) circuit 546.

The cycle-based delay circuit 542 receives an internal clock signal CLKin. Moreover, the cycle-based delay circuit 542 receives even-portion data $EVEN_{DQ}$ and odd-portion data $ODD_{DQ}$ from the memory controller 312 through the PHY circuit 314. In an embodiment, the cycle-based delay circuit 542 can selectively delay the even-portion data $EVEN_{DQ}$ or the odd-portion data $ODD_{DQ}$ for one to four clock cycles, and correspondingly generate delayed even-portion data $Ed_{DQ}$ and delayed odd-portion data $Od_{DQ}$. The delay line circuit 548 receives the internal clock signal CLKin. Optionally, the internal clock signal CLKin is delayed and divided into plural clock cycles by the delay line circuit 548. Consequently, the delay line circuit 548 generates a delayed internal clock signal CLKdin. For example, the internal clock signal CLKin is delayed by N/8 clock cycles by the delay line circuit 548, wherein N is an integer from 0 to 7.

The serializer 544 receives the delayed internal clock signal CLKdin. According to the delayed internal clock signal CLKdin, the serializer 544 samples the delayed even-portion data $Ed_{DQ}$ and the delayed odd-portion data $Od_{DQ}$ and generates the data signal DQ. Moreover, the I/O circuit 546 receives and outputs the data signal DQ.

As mentioned above, the data path circuit 540 can selectively control the delaying time of the data signal DQ. The delaying time is controlled to be in the range between 0 clock cycle and (4+⅞) clock cycles.

The clock path circuit 510 comprises a cycle-based delay circuit 512, a serializer 514, an input/output (I/O) circuit 516 and a delay line circuit 518. The clock path circuit 510 receives even-portion clock signals $EVEN_{CLK}$ and odd-portion clock signals $ODD_{CLK}$, and generates a clock signal CLK. The operating frequency of the clock signal CLK and the operating frequency of the internal clock signal CLKin are identical. The structure and the operation of the clock path circuit 510 are similar to those of the data path circuit 540, and not redundantly described herein.

The address/command path circuit 520 comprises a cycle-based delay circuit 522, a serializer 524 and an input/output (I/O) circuit 526. The address/command path circuit 520 receives even-portion addresses/commands $EVEN_{CA/CMD}$ and odd portion of addresses/commands $ODD_{CA/CMD}$, and generates an address/command signal CA/CMD. The structure and the operation of the address/command path circuit 520 are similar to those of the data path circuit 540, and not redundantly described herein. In this embodiment, the address/command path circuit 520 is used for adjusting the delaying time at the increment of one clock cycle only. Consequently, the delay line circuit is not shown. It is noted that the circuitry structure of the address/command path circuit may be modified. For example, in another embodiment, the address/command path circuit 520 is additionally equipped with a delay line circuit.

The DQS path circuit 530 comprises a cycle-based delay circuit 532, a serializer 534 and an input/output (I/O) circuit 536. The DQS path circuit 530 receives even-portion data strobes $EVEN_{DQS}$ and odd-portion data strobes $ODD_{DQS}$, and generates the first data strobe signal DQS_t. The second data strobe signal DQS_c is generated by using the similar circuitry structure. The structure and the operation of the DQS path circuit 530 are similar to those of the data path circuit 540, and not redundantly described herein. In this embodiment, the DQS path circuit 530 is used for adjusting the delaying time at the increment of one clock cycle only. Consequently, the delay line circuit is not shown. It is noted that the circuitry structure of the DQS path circuit may be modified. For example, in another embodiment, the DQS path circuit 530 is additionally equipped with a delay line circuit.

According to the technology of the present invention, the PHY circuit 314 is equipped with the control circuit for performing the multi-cycle write leveling process. After the multi-cycle write leveling process is completed, the control circuit can confirm that the signal edges of the clock signal CLK and the first data strobe signal DQS_t are aligned with each other and accurate. The control circuit of the PHY circuit 314 is configured to adjust the delaying times of the clock signal CLK, the address signal CA, the command signal CMD, the data signal DQ, the first data strobe signal DQS_t and the second data strobe signal DQS_c.

Figure 6A:
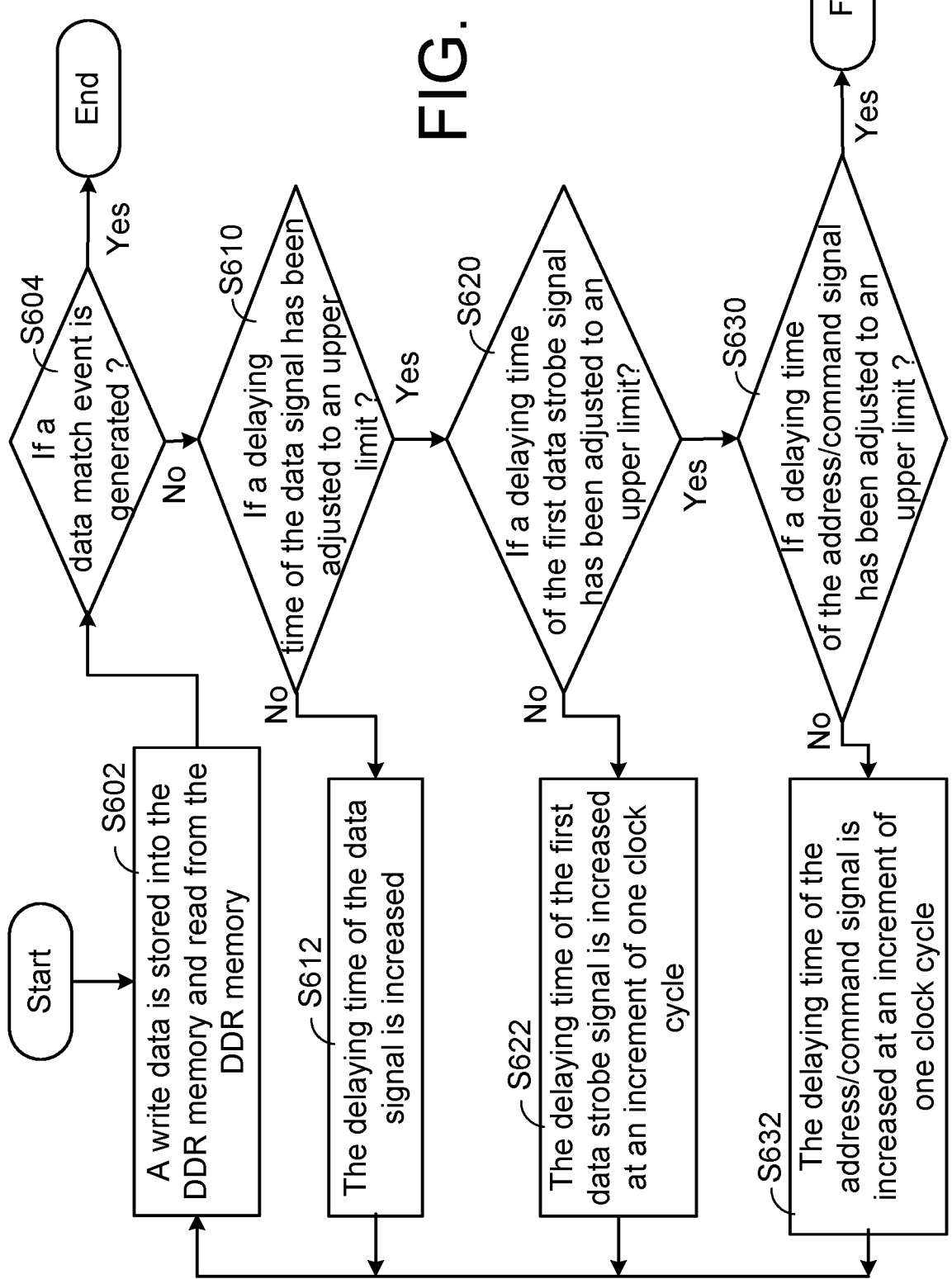
FIGS. 6A and 6B schematically illustrates a flowchart of a method for controlling a multi-cycle write leveling process according to an embodiment of the present invention.
Figure 6B:
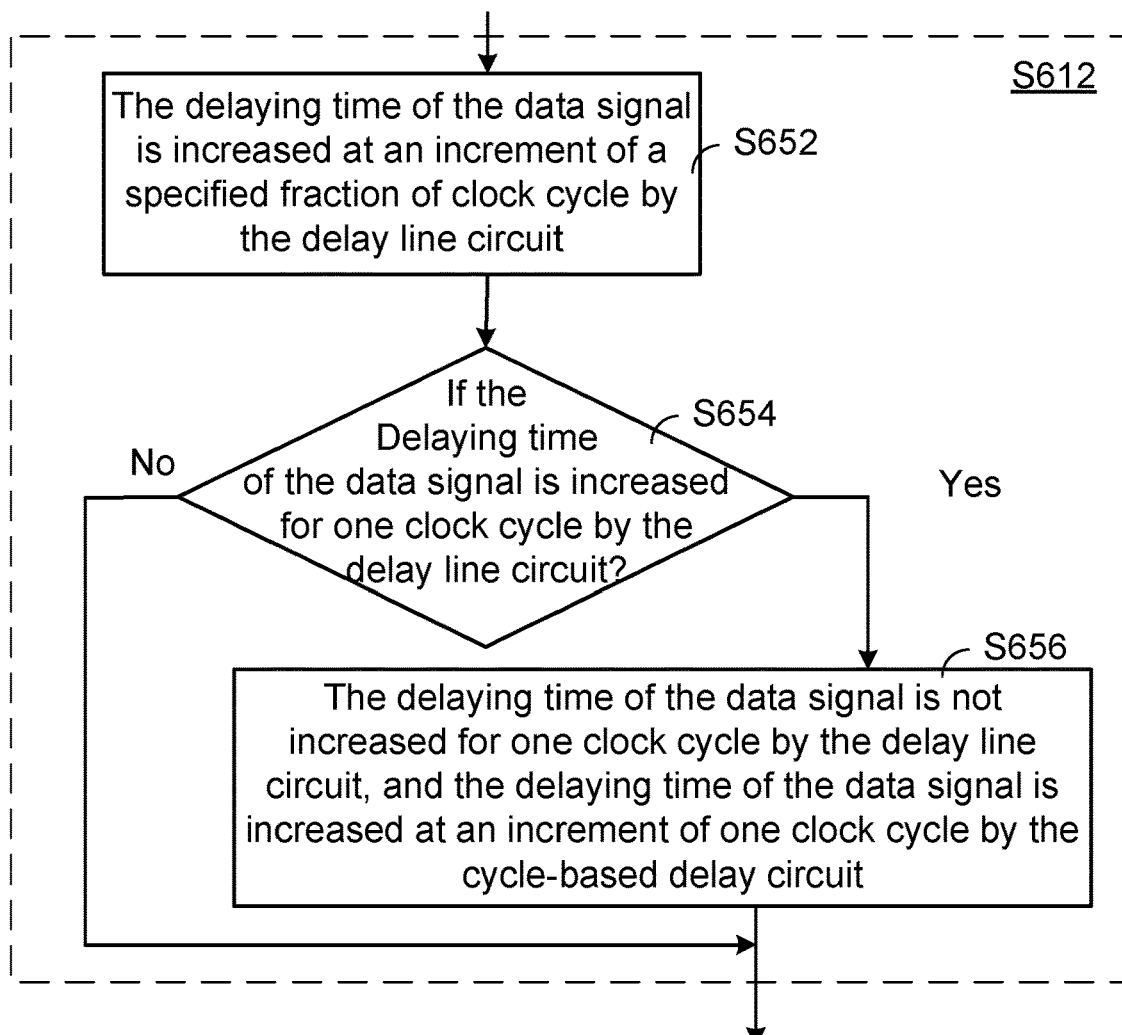

FIGS. 6A and 6B schematically illustrates a flowchart of a method for controlling a multi-cycle write leveling process according to an embodiment of the present invention. Generally, after the write leveling process of the memory system 300 is completed, the multi-cycle write leveling process is started.

Firstly, the processing circuit 310 issues a write command and a read command to store a write data into the DDR memory 120 and read the newly-stored write data from the DDR memory 120 (Step s602). Then, the processing circuit 310 judges whether a data match event is generated (Step S604).

In an embodiment, the memory system 300 issues the write command and the read command at a normal operating speed. If the write data from the DDR memory 120 and the write data from the processing circuit 310 are identical, it means that the data match event is generated. Whereas, if the write data from the DDR memory 120 and the write data from the processing circuit 310 are different, it means that the data match event is not generated.

If the processing circuit 310 judges that the data match event is generated, the multi-cycle write leveling process is completed. Whereas, if the processing circuit 310 judges that the data match event is not generated, the processing circuit 310 performs a delay control operation on the data signal DQ. Meanwhile, the processing circuit 310 judges whether a delaying time of the data signal DQ has been adjusted to an upper limit (Step S610). If the delaying time of the data signal DQ has not been adjusted to the upper limit, the delaying time of the data signal DQ is increased (Step S612) and then the step S602 is repeatedly done. Whereas, if the delaying time of the data signal DQ has been adjusted to the upper limit, the processing circuit 310 performs a delay control operation on the first data strobe signal DQS_t.

For example, in the data path circuit 540, the delaying time may be controlled to be in the range between 0 clock cycle and (4+⅞) clock cycles. Due to the cooperation of the cycle-based delay circuit 542 and the delay line circuit 548, the delaying time of the data signal DQ is gradually increased at the increment of ⅛ clock cycle until the delaying time reaches the upper limit, i.e., (4+⅞) clock cycles.

Moreover, before the delay control operation is performed on the first data strobe signal DQS_t, the delaying time of the data signal DQ is restored to the minimum delaying time by the processing circuit 310. Then, the processing circuit 310 judges whether a delaying time of the first data strobe signal DQS_t has been adjusted to an upper limit (Step S620). If the delaying time of the first data strobe signal DQS_t has not been adjusted to the upper limit, the delaying time of the first data strobe signal DQS_t is increased at an increment of one clock cycle (Step S622) and then the step S602 is repeatedly done. Whereas, if the delaying time of the first data strobe signal DQS_t has been adjusted to the upper limit, the processing circuit 310 performs a delay control operation on the address/command signal CA/CMD.

For example, in the DQS path circuit 530, the delaying time of the first data strobe signal DQS_t is controlled to be in the range between 0 clock cycle and 4 clock cycles. By the cycle-based delay circuit 532, the delaying time of the first data strobe signal DQS_t is gradually increased at the increment of 1 clock cycle until the delaying time reaches the upper limit, i.e., 4 clock cycles.

Moreover, before the delay control operation is performed on the address/command signal CA/CMD, the delaying time of the data signal DQ and the delaying time of the first data strobe signal DQS_t are restored to the minimum delaying time by the processing circuit 310. Then, the processing circuit 310 judges whether a delaying time of the address/command signal CA/CMD has been adjusted to an upper limit (Step S630). If the delaying time of the address/command signal CA/CMD has not been adjusted to the upper limit, the delaying time of the address/command signal CA/CMD is increased at an increment of one clock cycle (Step S632) and then the step S602 is repeatedly done. Whereas, if the delaying time of the address/command signal CA/CMD has been adjusted to the upper limit, it means that the multi-cycle write leveling process fails.

The address/command signal CA/CM is operated according to the clock signal CLK. In other words, after the address/command signal CA/CMD is delayed for one clock cycle, it is considered that the clock signal CLK has been adjusted for one clock cycle. Moreover, in the address/command path circuit 520, the delaying time of the address/command signal CA/CMD may be controlled to be in the range between 0 clock cycle and 4 clock cycles. By the cycle-based delay circuit 522, the delaying time of the address/command signal CA/CMD is gradually increased at the increment of 1 clock cycle until the delaying time reaches the upper limit, i.e., 4 clock cycles.

Moreover, after the processing circuit 310 judges that the data match event is generated, the processing circuit 310 records the delaying times of the data signal DQ, the address/command signal CA/CMD, the first data strobe signal DQS_t and the second data strobe signal DQS_c at this moment. Then, the processing circuit 310 continuously performs the write training process. Consequently, during the write training process, the DDR memory 120 can accurately acquire the data from the processing circuit 310 through the data signal DQ according to the first data strobe signal DQS_t and the second data strobe signal DQS_c.

Please refer to FIG. 6B. The step S612 of increasing the delaying time of the data signal DQ by the data path circuit 540 includes the following steps. Firstly, the delaying time of the data signal DQ is increased at an increment of a specified fraction of clock cycle by the delay line circuit 548 (Step S652). For example, the specified fraction of clock cycle is ⅛ clock cycle. Then, a step S548 is performed to judge whether the delaying time of the data signal DQ is increased for one clock cycle by the delay line circuit 548 (Step S654). If the judging condition of the step S654 is satisfied, the delay line circuit 548 stops increasing the delaying time of the data signal DO for one clock cycle and the cycle-based delay circuit 542 increases the delaying time of the data signal DQ at an increment of one clock cycle (Step S656). In other words, the delay line circuit 548 is reset, and the delaying time of the data strobe signal adjusted by the delay line circuit 548 is zeroed.

As mentioned above, the cooperation of the cycle-based delay circuit 542 and the delay line circuit 548 in the data path circuit 540 can gradually increase the delaying time of the data signal DQ at the increment of ⅛ clock cycle until the delaying time reaches the upper limit, i.e., (4+⅞) clock cycles. In some situations, a channel of the address/command signal CA/CMD contains two byte lanes. For example, the two byte lanes include a zero-byte lane and a first-byte lane. After the multi-cycle write leveling process, the delaying times of the two byte lanes may be different. Consequently, it is necessary to further adjust the delaying time of each signal in the memory system.

Figure 7:
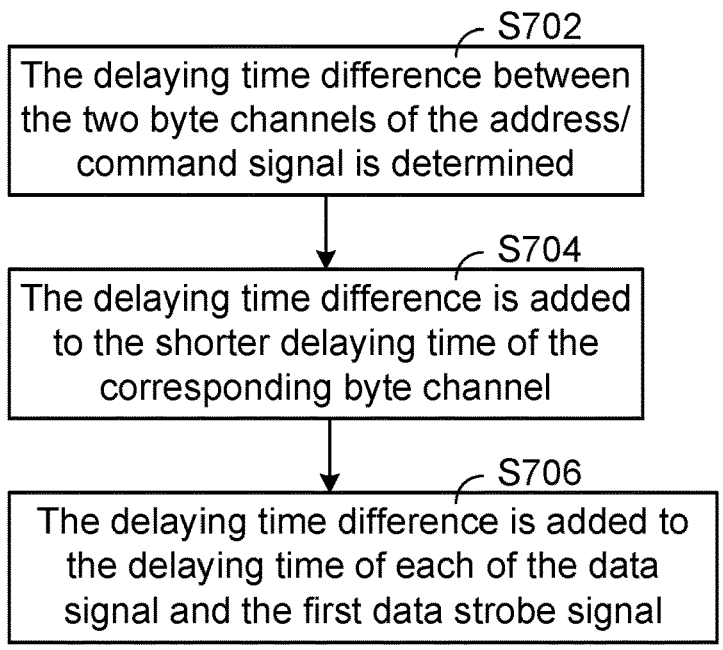
FIG. 7 schematically illustrates a method of performing a delay control operation on the address/command signal.

FIG. 7 schematically illustrates a method of performing a delay control operation on the address/command signal CA/CMD. Firstly, the delaying time difference between the two byte channels of the address/command signal CA/CMD is determined (Step S702). Then, the delaying time difference is added to the shorter delaying time of the corresponding byte channel (Step S704). Then, the delaying time difference is added to the delaying time of each of the data signal DQ and the first data strobe signal DQS_t (Step S706).

For example, the delaying time of the zero-byte lane of the address/command signal CA/CMD is equal to one clock cycle, and the delaying time of the first-byte lane of the address/command signal CA/CMD is equal to two clock cycles. That is, the delaying time difference between the two byte channels of the address/command signal CA/CMD is equal to one clock cycle. Since the delaying time of the zero-byte lane is shorter. Consequently, the delaying time difference (i.e., one clock cycle) is added to the delaying time of the zero-byte lane by the processing circuit 310. Consequently, the delaying time of the zero-byte lane is increased to 2 clock cycles. Then, the delaying time difference (i.e., one clock cycle) is added to the delaying time of the data signal DQ and the delaying time of the first data strobe signal DQS_t. Consequently, the processing circuit 310 can confirm that the signal edges of all signals are accurate. Then, the write training process is performed.

From the above descriptions, the present invention provides a method for controlling a multi-cycle write leveling process in a memory system. After the write leveling process of the memory system is completed and before the write training process is performed, the multi-cycle write leveling process of the present invention is performed. Consequently, when the DDR memory receives the clock signal CLK and the first data strobe signal DQS_t, the DDR memory can confirm that the signal edges of the clock signal CLK and the first data strobe signal DQS_t are aligned with each other and the signal edges are accurate.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for controlling a multi-cycle write leveling process in a memory system, the memory system comprising a DDR memory, the method comprising steps of:
   (a) storing a write data into the DDR memory, and reading the write data from the DDR memory;
   (b) judging whether the write data stored in the DDR memory and the write data read from the DDR memory match each other to generate a data match event, wherein if the data match event is not generated, judging whether a first delaying time of a data signal has been adjusted to a first upper limit;

(c) if the first delaying time of the data signal has not been adjusted to the first upper limit, increasing the first delaying time of the data signal and then going back to the step (a);

(d) if the first delaying time of the data signal has been adjusted to the first upper limit, judging whether a second delaying time of a first data strobe signal has been adjusted to a second upper limit;

(e) if the second delaying time of the first data strobe signal has not been adjusted to the second upper limit, increasing the second delaying time of the first data strobe signal and then going back to the step (a);

(f) if the second delaying time of the first data strobe signal has been adjusted to the second upper limit, judging whether a third delaying time of an address/command signal has been adjusted to a third upper limit; and (g) if the third delaying time of the address/command signal has not been adjusted to the third upper limit, increasing the third delaying time of the address/command signal and then going back to the step (a).

2. The method as claimed in claim 1, wherein before the step (a), the memory system performs a write leveling process, so that a signal edge of a clock signal and a signal edge of the first data strobe signal are aligned with each other.

3. The method as claimed in claim 1, wherein if the write data stored in the DDR memory and the write data read from the DDR memory are identical, the data match event is generated, wherein if the write data stored in the DDR memory and the write data read from the DDR memory are different, the data match event is not generated.

4. The method as claimed in claim 1, wherein the step (c) further comprises a sub-step of increasing the first delaying time of the data signal at an increment of a specified fraction of clock cycle.

5. The method as claimed in claim 4, wherein a data path circuit of the memory system comprises a cycle-based delay circuit and a delay line circuit, and the step (c) further comprises sub-steps of:

using the delay line circuit to increase the first delaying time of the data signal at the increment of the specified fraction of clock cycle; and judging whether the first delaying time of the data signal is increased for one clock cycle by the delay line circuit, wherein if the first delaying time of the data signal is increased for one clock cycle by the delay line circuit, the first delaying time of the data signal is not increased by the delay line circuit, and the first delaying time of the data signal is increased at an increment of one clock cycle by the cycle-based delay circuit.

6. The method as claimed in claim 1, wherein in the step (e), the second delaying time of the first data strobe signal is increased at an increment of one clock cycle.

7. The method as claimed in claim 1, wherein in the step (g), the third delaying time of the address/command signal is increased at an increment of one clock cycle.

8. The method as claimed in claim 1, wherein if the data match event is generated in the step (b), the first delaying time, the second delaying time and the third delaying time are recorded and used for a write training process.

9. The method as claimed in claim 8, further comprising steps of:

determining a delaying time difference between two byte channels of the address/command signal;

adding the delaying time difference to the shorter delaying time of the corresponding byte channel; and adding the delaying time difference to the first delaying time of the data signal, and adding the delaying time difference to the second delaying time of the first data strobe signal.

* * * * *